US012724053B2

(12) United States Patent
Thiesies et al.

(10) Patent No.: US 12,724,053 B2
(45) Date of Patent: Sep. 1, 2026

(54) ADAPTER ARRANGEMENT FOR AUTOMATED CHARACTERIZATION OF ANTENNAS

(71) Applicant: GAPWAVES AB, Gothenburg (SE)

(72) Inventors: Heiko Thiesies, Torslanda (SE); Marcus Hasselblad, Mölndal (SE)

(73) Assignee: Gapwaves AB, Gothenburg (SE)

( * ) Notice: Subject to any disclaimer, the term of this patent is extended or adjusted under 35 U.S.C. 154(b) by 107 days.

(21) Appl. No.: 18/571,835

(22) PCT Filed: Jun. 20, 2022

(86) PCT No.: PCT/EP2022/066715
§ 371 (c)(1),
(2) Date: Dec. 19, 2023

(87) PCT Pub. No.: WO2022/268709
PCT Pub. Date: Dec. 29, 2022

(65) Prior Publication Data

US 2024/0280623 A1 Aug. 22, 2024

(30) Foreign Application Priority Data

Jun. 21, 2021 (SE) .................................... 2130170-0

(51) Int. Cl.
*G01R 29/10* (2006.01)
*G01R 29/08* (2006.01)
*H01P 1/165* (2006.01)

(52) U.S. Cl.
CPC ......... *G01R 29/10* (2013.01); *G01R 29/0821* (2013.01); *H01P 1/165* (2013.01)

(58) Field of Classification Search
CPC ......... G01R 29/10; H01P 5/107; H01P 1/165; H01P 1/042
See application file for complete search history.

(56) References Cited

U.S. PATENT DOCUMENTS 10,283,876 B1 * 5/2019 Livadaru .............. H01Q 21/245
10,811,373 B2 10/2020 Zaman et al.
(Continued)

FOREIGN PATENT DOCUMENTS

EP 4359807 A1 5/2025
JP 2018507594 A 3/2018
(Continued)

OTHER PUBLICATIONS

International Search Report and Written Opinion for Application No. PCT/EP2022/066715 dated Sep. 19, 2022 (13 pages).
(Continued)

*Primary Examiner* — Eman A Alkafawi
*Assistant Examiner* — Suresh K Rajaputra
(74) *Attorney, Agent, or Firm* — Barnes & Thornburg LLP

(57) ABSTRACT

An adapter arrangement (100) for automated characterization of an antenna under test, AUT, (120) with a plurality of radiation elements (123, 124). The adapter arrangement (100) comprises a plate (110) with a first side (111) and a second side (112), and two or more waveguides (115) extending through the plate (110). Each waveguide has a first aperture (113) arranged on the first side (111) of the plate and a second aperture (114) arranged on the second side (112) of the plate. The second apertures (114) are arranged to mate with respective groups of radiation elements (123) of the AUT (120), where a group comprises one or more radiation elements. The first apertures (113) are arranged to mate with a first probe (130) with a first probe aperture (131). At least one of the first apertures (113) and/or the first probe aperture (131) is surrounded by a metamaterial structure (116).

20 Claims, 4 Drawing Sheets

(56) References Cited

U.S. PATENT DOCUMENTS

| | | | | |
|---|---|---|---|---|
| 2011/0193566 | A1* | 8/2011 | Nyshadham | H01Q 21/062 324/637 |
| 2011/0260946 | A1* | 10/2011 | Dandekar | H01Q 15/006 343/893 |
| 2018/0108964 | A1* | 4/2018 | Adas | H01Q 21/065 |
| 2018/0269557 | A1* | 9/2018 | Fangfang | H01P 3/121 |
| 2019/0123411 | A1* | 4/2019 | Carlred | H01P 5/024 |
| 2019/0140344 | A1 | 5/2019 | Kirino et al. | |
| 2020/0021369 | A1 | 1/2020 | Huynh et al. | |
| 2020/0381793 | A1* | 12/2020 | Rahiminejad | H01P 11/00 |
| 2021/0356504 | A1* | 11/2021 | Bencivenni | H01P 5/107 |
| 2022/0109246 | A1* | 4/2022 | Emanuelsson | H01P 3/123 |
| 2022/0131571 | A1* | 4/2022 | Lukyanov | H01Q 1/38 |

FOREIGN PATENT DOCUMENTS

| | | | |
|---|---|---|---|
| WO | 2020078653 | A1 | 4/2020 |
| WO | 2021037364 | A1 | 3/2021 |
| WO | 2022268709 | A1 | 12/2022 |

OTHER PUBLICATIONS

Rahiminejad, Sofia, et al. "Micromachined contactless pin-flange adapter for robust high-frequency measurements." Journal of Micromechanics and Microengineering 24.8 (2014): 084004.

* cited by examiner

ADAPTER ARRANGEMENT FOR AUTOMATED CHARACTERIZATION OF ANTENNAS

CROSS-REFERENCE TO RELATED APPLICATIONS

This application is a U.S. national counterpart application of International Application Serial No. PCT/EP2022/066715, filed Jun. 20, 2022, which claims priority to and the benefit of Swedish Patent Application No. 2130170-0, filed Jun. 21, 2021, the content of each which is incorporated by reference herein in its entirety.

TECHNICAL FIELD

The present disclosure relates to wireless transmission systems in general, and to measurement equipment for antenna characterization in particular. There are disclosed arrangements and equipment which facilitate measurements of antenna characteristics.

BACKGROUND

Wireless communication networks comprise radio frequency transceivers, such as radio base stations used in cellular access networks, microwave radio link transceivers used for, e.g., backhaul into a core network, and satellite transceivers which communicate with satellites in orbit. A radar transceiver is also a radio frequency transceiver since it transmits and receives radio frequency (RF) signals, i.e., electromagnetic signals.

The radiation arrangement of a transceiver often comprises an array antenna, since an array allows high control of shaping the radiation pattern, e.g., for high directivity, beam steering, and/or multiple beams.

It is important to be able to determine antenna characteristics, such as radiated power before and sometimes also during operation. Antenna characterization techniques refers to the evaluation of antenna performance and testing of antennas to ensure that the antenna meets specifications. Typical parameters for characterization of antennas are, e.g., matching, radiation element gain, antenna gain, transmitter output power, power distribution over an antenna array, noise figure, gain-settings, and the like.

Known antenna measurement techniques are costly, time consuming, and often require large footprint measurement facilities. Furthermore, antennas become rather small in size at higher frequencies, which increases the requirements on mechanical precision.

There is a need for improved antenna measurement techniques and equipment which simplify antenna characterization.

SUMMARY

It is an object of the present disclosure to provide improved antenna measurement techniques and equipment, which, i.a., offer fast and easy characterization, a small footprint, and high accuracy.

This object is at least in part obtained an adapter arrangement for automated characterization of an antenna under test (AUT) with a plurality of radiation elements. The adapter arrangement comprises a plate with a first side and a second side, and two or more waveguides extending through the plate. Each waveguide has a first aperture arranged on the first side of the plate and a second aperture arranged on the second side of the plate. The second apertures are arranged to mate with respective groups of radiation elements of the AUT, where a group comprises one or more radiation elements. The first apertures are arranged to mate with a first probe with a first probe aperture. At least one of the first apertures and/or the first probe aperture is surrounded by a metamaterial structure.

The adapter arrangement makes it possible for the first probe in the measurement setup above to be only moved in a plane (rather than three dimensions) and in some cases only in one dimension. Furthermore, precision requirements are reduced by the use of metamaterial structures. Therefore, the adapter arrangement makes it possible to cut down the characterization time of a AUT to seconds, rather than minutes.

Another advantage of the disclosed adapter arrangement and relating methods is that the first apertures of the plate can be arranged in a standard pattern. This way, the movement of the first probe (i.e., relative movement between the first probe and the plate) can always be the same for a large number of different AUTs (with different positioning of the radiation elements). That way, it is possible for the moving arrangement (e.g., linear motors) to be more robust and precise compared to a scenario where the movement is different for different AUTs.

Furthermore, the radiation elements of the AUT may not be separated enough for a proper mating with the first probe (if the first probe would mate directly with the AUT). The adapter arrangement may increase the separation the element (first aperture on the plate) the first probe is arranged to mate with.

According to aspect, all first apertures are surrounded by a metamaterial structure. This way, the first probe can easily move between all first apertures.

According to aspect, the metamaterial structure comprises a repetitive structure of protruding elements. This is a good performing structure that is easy to manufacture. The repetitive structure may, e.g., be machined directly into a layers or member. This is an advantage since such machining can be performed in a cost-effective manner with high mechanical precision. This type of integrally formed repetitive structure is also mechanically stable, which is an advantage.

According to aspect, the second side of the plate is arranged to be secured to the AUT by vacuum and/or fastening means. This way, the plate can be attached to the AUT securely and quickly.

According to aspect, the first apertures are arranged to individually mate with the first probe with a gap between the first probe and the individual aperture. This way, the first probe can easily move between all first apertures.

According to aspect, the gap is less than a wavelength of a center frequency in a band of operation, preferably less than a half of a wavelength of the center frequency, and more preferably less than a quarter of a wavelength of the center frequency.

According to aspect, the radiation elements of the AUT are feed ports on a distribution layer of the AUT. According to further aspect, the radiation elements of the AUT are radiation elements on a radiation layer of the AUT.

According to aspect, at least one of the one or more of the second apertures is surrounded by a metamaterial structure. This provides a good transition from the second aperture into the AUT that has low loss and high isolation, and that is easy to manufacture. According to aspect, the metamaterial structure surrounding the one or more of the second apertures comprises a repetitive structure of protruding elements.

According to aspect, at least one of the waveguides is arranged to rotate the polarization of the electromagnetic signal traversing the waveguide. This way, the second probe does not have to rotate to match polarization, which is an advantage.

There is also disclosed herein a kit of parts comprising a first probe with a first probe aperture and the adapter arrangement according to the discussions above. In the kit, at least one of the first apertures and/or the first probe aperture is surrounded by a metamaterial structure.

There is also disclosed herein a method for characterizing an antenna under test, (AUT) with a plurality of primary and a plurality of secondary radiation elements, using an adapter arrangement and a first probe with a first probe aperture. The adapter arrangement comprises a plate with a first side and a second side, and two or more waveguides extending through the plate. Each waveguide has a first aperture arranged on the first side of the plate and a second aperture arranged on the second side of the plate. The second apertures are arranged to mate with respective groups of primary radiation elements of the AUT, where a group comprises one or more primary radiation elements. The first apertures are arranged to mate with a first probe with a first probe aperture. At least one of the first apertures and/or the first probe aperture is surrounded by a metamaterial structure.

The method comprises:

arranging the first probe to mate with a first aperture of one of the two or more waveguides in the adapter arrangement; and arranging the two or more second apertures of respective waveguides in the adapter arrangement to mate with respective group of primary radiation elements the AUT, wherein a primary element is internally connected in the AUT to a group of secondary radiation elements, where a group comprises one or more secondary radiation elements.

According to aspect, the method further comprises providing one or more second probes to couple with the two or more groups.

According to aspect, the method further comprises arranging, by a relative movement between the first probe and the adapter arrangement, the first probe to couple with another first aperture of one of the two or more waveguides in the adapter arrangement.

According to aspect, the relative movement may comprise respective linear movement in one or two dimensions.

According to aspects least, at least two first probes are arranged to mate with respective first apertures.

There is also disclosed herein a computer program comprising program code means for performing the steps discussed above when said program is run on a computer or on processing circuitry of a control unit.

The methods disclosed herein are associated with the same advantages as discussed above in connection to the different apparatuses. There are furthermore disclosed herein control units adapted to control some of the operations described herein.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

The present disclosure will now be described in more detail with reference to the appended drawings, where.

DETAILED DESCRIPTION

Figure 1:
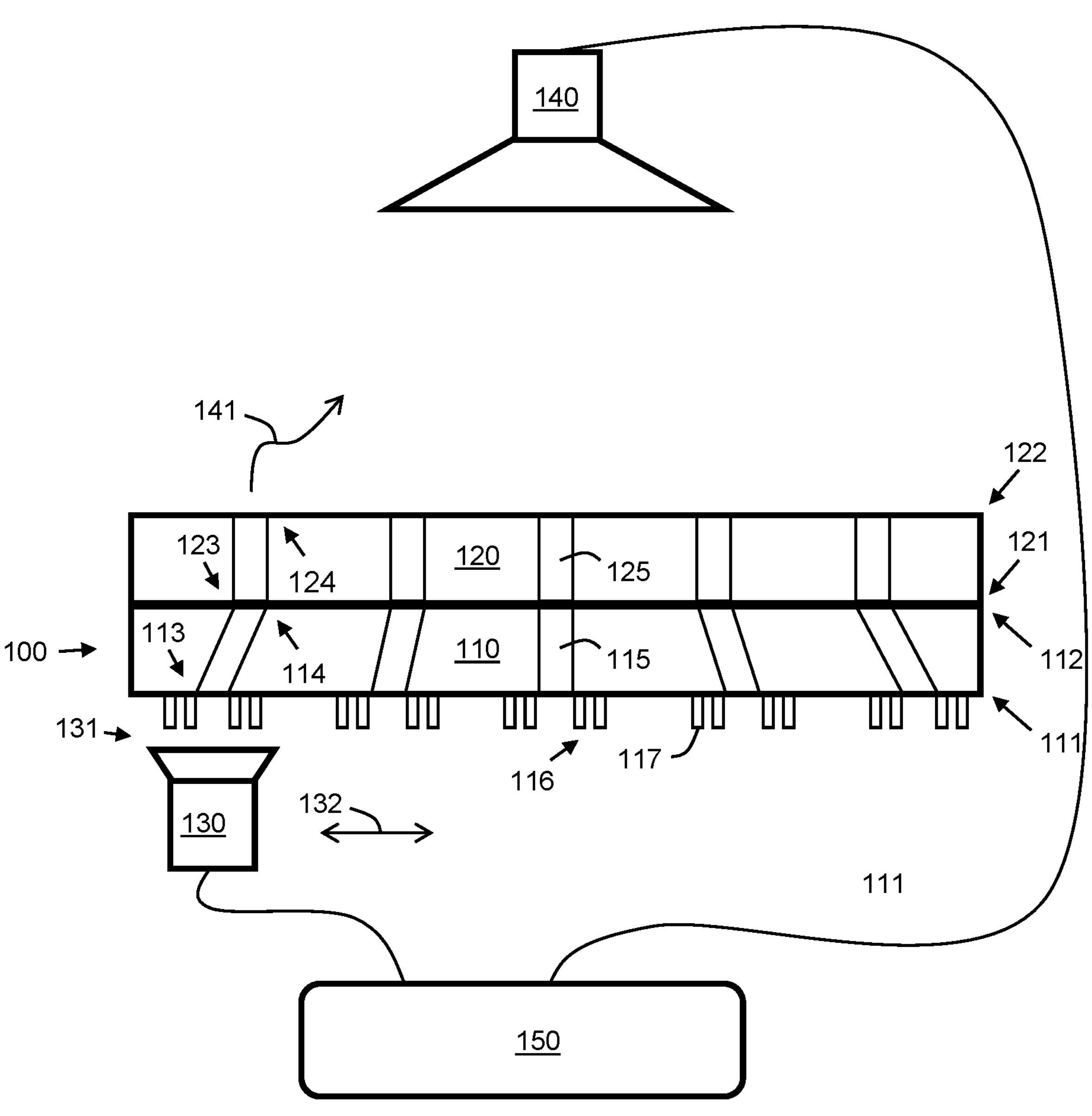
FIG. 1 schematically illustrates a measurement system with an antenna under test and an adapter arrangement.

Aspects of the present disclosure will now be described more fully with reference to the accompanying drawings. The different devices and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

One characterization of an antenna under test (AUT) is to measure S-parameters of one or more waveguiding paths in the AUT. For example, it can be interesting to measure the S-parameters from a feeding port in the AUT to one or more radiating elements in the AUT. For example, a stacked layer array antenna may comprise a distribution layer with a plurality of feed ports, where each feed port distributes a signal to respective columns of slots. In such an array, the feed port may arrange to be connected to a printed circuit board (PCB) comprising circuits. It is often possible to disconnect the PCB and other components from the part of the AUT comprising the feed ports and the radiating elements. In the example array, each feed port connected to its respective column of slots can be a waveguiding path. Characteristics of such path can be measured by injecting an electromagnetic signal into the feed port and measure the radiated signals from the column of radiation elements. In particular, a first probe may be mated with one of the feed ports, and a second probe may be arranged away from the AUT (e.g., in the far-field) to receive radiated signals from the AUT. To measure another waveguiding path, the first probe can be moved to another feed port.

In such characterization setup, the second probe may be arranged fixed, i.e., not moving, relative to room, chamber or the like. The first probe and the AUT, however, must move relative to each other when the probe is moved from one feed port to another. This can be arranged in a number of different ways. For example, the first probe may be fixed relative to the room and only the AUT moves, or vice versa, or both move relative to the room. It also possible that second probe is moved relative to the room, e.g., to adjust the distance to the AUT. In any of those cases, any impact of the path between one or more radiating apertures on the AUT to the second probe may be compensated for by calibration.

As mentioned, the second probe may be arranged at a distance from the AUT. One reason is that the radiating elements of the AUT are designed to radiate, which means that the radiated signal may not have lost too much power at distance. It also means that the radiation pattern is relatively known. This way it also possible to easily measure the radiation from a plurality of radiation elements simultaneously, e.g., of whole column. In addition, arranging the second probe too close to the radiating elements may affect the behavior of the AUT, which is undesirable when doing characterization.

The feed ports of the AUT, on the other hand, may be more suitable to mate with the first probe. During such mating, it is important that the transition from the first probe to the feed port does not leak, since that may degrade the accuracy of, or even ruin, the characterization. Careful mating of the first probe, however, is normally very time consuming. To be mated, the probe may first have to be moved in a plane along the AUT and then in a direction towards the AUT. This movement must be very precise to get repeatable measurements. High precision movement in three dimensions is very time consuming. In the mated position, the probe should preferably be precisely secured to the AUT by some means, e.g., screws, which also is time consuming. For these reasons, the time it takes to characterize an AUT may take several minutes, which is undesirable, especially in large scale production of AUTs.

Therefore, there is disclosed herein an adapter arrangement 100 which provides improved antenna measurement techniques. The adapter arrangement makes it possible for the first probe in the measurement setup above to be only moved in a plane (rather than three dimensions) and in some cases only in one dimension. Furthermore, precision requirements are reduced by the use of metamaterial structures. Therefore, the adapter arrangement 100 makes it possible to cut down the characterization time of each AUT in units of seconds, rather than minutes.

Figure 2:
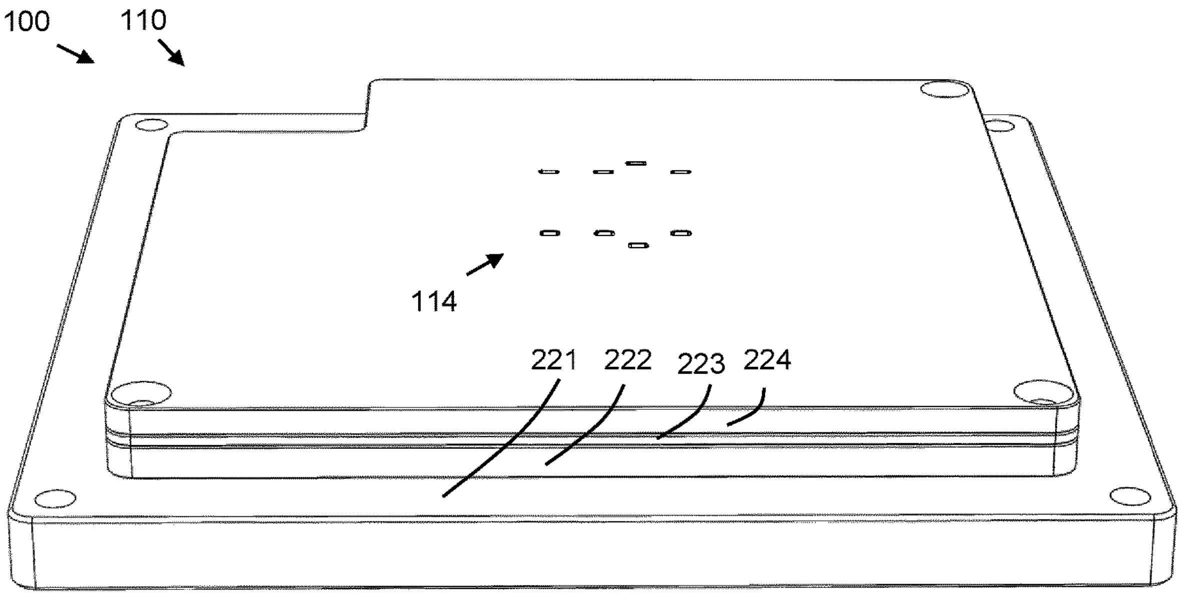
FIGS. 2 and 3 show different views of an example adapter arrangement.
Figure 3:
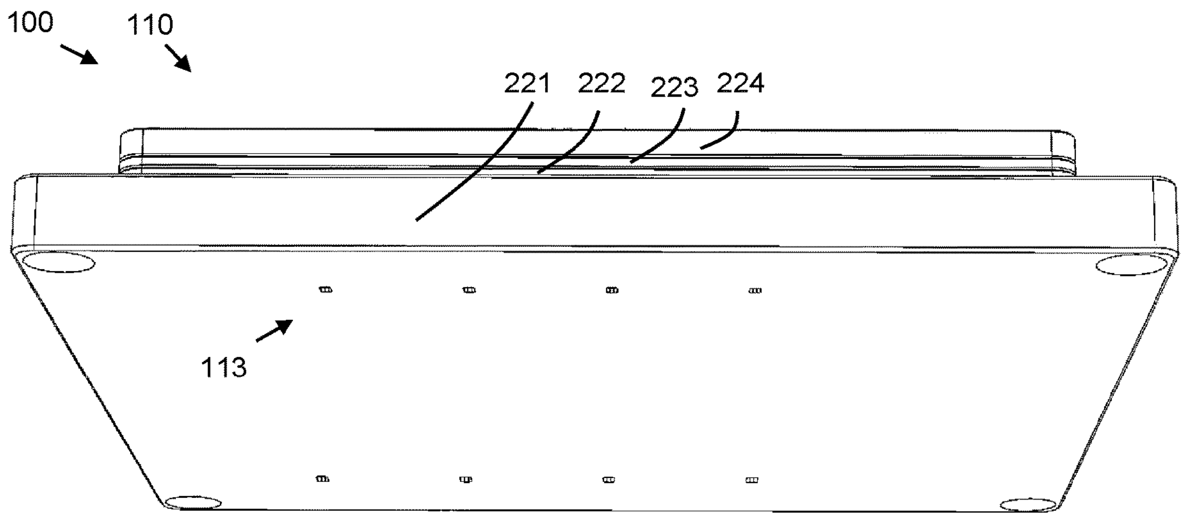

To summarize, and with reference to FIGS. 1-3, there is disclosed herein an adapter arrangement 100 for automated characterization of an AUT with a plurality of radiation elements 123, 124. The adapter arrangement 100 comprises a plate 110 with a first side 111 and a second side 112, and two or more waveguides 115 extending through the plate 110. Each waveguide has a first aperture 113 arranged on the first side 111 of the plate and a second aperture 114 arranged on the second side 112 of the plate. The second apertures 114 are arranged to mate with respective groups of radiation elements 123 of the AUT 120, where a group comprises one or more radiation elements. The first apertures 113 are arranged to mate with a first probe 130 with a first probe aperture 131. At least one of the first apertures 113 and/or the first probe aperture 131 is surrounded by a metamaterial structure 116.

Herein, the feed port (e.g., a waveguide feed) of an AUT is an aperture which can transmit and receive electromagnetic waves and is therefore also considered a radiation element of the AUT. Thus, the radiation elements 123 of the AUT 120 may be feed ports on a distribution layer of the AUT. The radiation elements 124 of the AUT 120 can also be radiation elements on a radiation layer of the AUT. In general, one of the second apertures of the adapter arrangement may mate with one or more feed ports of the AUT, one or more apertures on a radiation layer (e.g., slots), or other apertures suitable to transmit and receive electromagnetic waves. In a preferred embodiment, however, one second aperture of the adapter arrangement is mated with one feed port of the AUT.

Another advantage of the disclosed adapter arrangement and relating methods is that the first apertures of the plate can be arranged in a standard pattern. This way, the movement of the first probe (i.e., relative movement between the first probe and the plate) can always the same for a large number of different AUTs (with different positioning of the radiation elements). That way, it is possible for the moving arrangement (e.g., linear motors) to be more robust and precise compared to a scenario where the movement is different for different AUTs. The adapter plate may therefor custom built for each type of AUT.

Furthermore, the radiation elements of the AUT may not be separated enough for a proper mating with the first probe (if the first probe would mate directly with the AUT). The adapter arrangement may increase the separation the element (first aperture on the plate) the first probe is arranged to mate with. This may especially be useful when measuring channel isolation. According to aspects, all first apertures are arranged in a single row. According to further aspects, the first apertures are arranged periodically.

The adapter arrangement 100 and relating techniques are suitable for measuring S-parameters of one or more of the waveguiding paths in the AUT. However, other antenna characterization and/or transceiver characterization is also possible, such as, e.g., matching, radiation element gain, antenna gain, transmitter output power, power distribution over an antenna array, noise figure, gain-settings, error vector magnitude, and the like.

The adapter arrangement may be used in a measurement setup with the first probe and with a second probe arranged at a distance from the AUT. However, the adapter arrangement can also be used in other setups and scenarios.

The first apertures 113 are arranged to mate with a first probe 130 with a first probe aperture 131. Preferably, the first probe mates with a single first aperture at a time, but it is possible that the first probe mates with a plurality of first apertures at a time.

In an example embodiment, the first probe mates with a single first aperture at a time, and each second aperture is mated with a respective feed port on the AUT, where each feed port is internally connected 125 in the AUT to one or more slots.

With a metamaterial structure arranged on one (or more) first aperture 113 of the adapter arrangement and/or the first probe aperture 131, the measurement probe may be mated with the second aperture with direct contact or a distance, where the distance should be smaller than a quarter of a wavelength of center frequency of operation of the antenna arrangement 100. Direct contact can mean that only sections of the two layers are in contact.

The use of metamaterial structures provides low and high isolation of the transition. Another advantage is that there is no need for electrical contact between the two layers constituting the waveguide. This is an advantage since high precision assembly is not necessary since electrical contact need not be verified. Electrical contact between the layers is, however, also an option. In addition, the metamaterial structure provides relaxed tolerances in the exact placement of the measurement probe due to the high isolation. A gap between the probe and the aperture allows for a relative movement of the probe in only one plane, when moving between apertures, which is an advantage.

The metamaterial structure may be arranged to form a high-impedance surface, such as an artificial magnetic conductor (AMC). If the high-impedance faces an electrically conductive surface (i.e., a low-impedance surface such as a perfect electric conductor, PEC, in the ideal case), and if the two surfaces are arranged at a distance apart less than a quarter of a wavelength at a center frequency, no electromagnetic waves in a frequency band of operation can, in the ideal case, propagate along or between the intermediate surfaces since all parallel plate modes are cut-off in that frequency band. In other words, the high-impedance surface, and the low-impedance surface form an electromagnetic bandgap between the two surfaces. The two surfaces may also be arranged directly adjacent to each other, i.e., electrically connected to each other.

According to aspects, the first apertures 113 are arranged to individually mate with the first probe 130 with a gap between the first probe and the individual aperture. In that case, the gap is preferably less than a wavelength of a center frequency in a band of operation, preferably less than a half of a wavelength of the center frequency, and more preferably less than a quarter of a wavelength of the center frequency. The center frequency is often in the middle of the frequency band of operation.

In a realistic scenario, the electromagnetic waves in the frequency band of operation are attenuated per length along the intermediate surfaces. Herein, to attenuate is interpreted as to significantly reduce an amplitude or power of electromagnetic radiation, such as a radio frequency signal. The attenuation is preferably complete, in which case attenuate and block are equivalent, but it is appreciated that such complete attenuation is not always possible to achieve.

The metamaterial 116 surrounds the intended passage, i.e., between one (or more) first aperture 113 and the first probe aperture 131. Herein, to surround is interpreted broadly, i.e., including surrounding at least a part of the passage. The metamaterial structure preferably completely surrounds the passage to provide high isolation. However, it is understood that if the metamaterial does not completely surround, the technical effect may still be achieved to some effect with some of the same technical advantage. Furthermore, all first apertures 113 may surrounded by a metamaterial structure 116. The metamaterial structure may comprise subsections or be a continuous structure surrounding the apertures.

The metamaterial structure 116 may comprise a repetitive structure of protruding elements 117. Such protruding elements may be monolithically formed on the plate 110 and/or first probe 130. Many other types of metamaterial structures exist as well.

The second side 112 of the plate 110 may arranged to be secured to the AUT 120 by vacuum and/or fastening means. Since a number of second apertures of the adapter arrangement may be connected to respective feed ports of the AUT (for example), there may not be any need to move the adapter plate relative to the AUT during characterization. In that case, the adapter plate may be securely attached to the AUT using vacuum, e.g. Since such operation is only done once per AUT, some time for secure attachment can be afforded.

At least one of the one or more of the second apertures 114 may be surrounded by a metamaterial structure. This may in some scenarios improve the transition from the adapter arrangement to the AUT. In that case, the metamaterial structure surrounding the one or more of the second apertures 114 may comprises a repetitive structure of protruding elements. Furthermore, the radiation element of the AUT can also be surrounded by a metamaterial structure, in combination with, or instead of the second apertures.

A first aperture 113 arranged on the first side 111 of the plate is connected to a second aperture 114 arranged on the second side 112 of the plate via a waveguide. This waveguide may be a hollow waveguide, dielectrically filled waveguide etc. In general, it is a structure that guides an electromagnetic signal between a first and a second aperture. At least one of the waveguides 115 may be arranged to rotate the polarization of the electromagnetic signal traversing the waveguide. This way, different polarization of the AUT can be measured without having to rotate the probe, which is an advantage. Any additional movement to a planar movement reduces precision. This is especially true for rotation. Furthermore, additional movement takes time, which is undesired.

There is also disclosed herein a kit of parts comprising a first probe 130 with a first probe aperture 131 and the adapter arrangement 100 according to the discussions above. In the kit, at least one of the first apertures 113 and/or the first probe aperture 131 is surrounded by a metamaterial structure 116.

FIG. 1 shows an example measurement setup. The setup comprises the adapter arrangement 100 attached to an AUT 120, a measurement first measurement probe 130, a second measurement probe 140, and measurement equipment 150. The first and second probes are connected the measurement equipment. The measurement equipment may be a vector network analyzer. The adapter arrangement is connected to feed ports on a distribution layer of the AUT. These feed ports are examples of respective primary radiation elements 123 of the AUT 120. Each primary radiation element on a first side 121 of the AUT is internally connected 125 in the AUT to a group of secondary radiation elements on a second side 122 of the AUT, where a group comprises one or more secondary radiation elements 124 (e.g., slots). The second probe is arranged at a distance from the secondary radiation elements, where the secondary radiation elements are arranged to radiate 141 into the second probe.

The first probe 130 is arranged to be moved relative to the adapter plate, which means that one or none of them can be stationary relative to the room or measurement chamber the setup is in. The second probe 140 is normally stationary relative to the room but may be moved. It may e.g. be moved to keep a constant distance to the group of secondary radiation elements being measured.

The AUT may be flipped, and the adapter plate may be connected to the secondary radiation elements instead. In another embodiment, there are two plates: one each side of the AUT. In yet another embodiment, the AUT is stationary relative to the room and a single plate moving between the still AUT and a still first probe.

FIGS. 2 and 3 show different views of an example adapter arrangement 100. The plate 110 comprises four subplates. In general, the plate may comprise a single piece or it may comprise several subplates. In the example arrangement in FIGS. 2 and 3, the subplates are an AUT adaption plate 224, a first waveguiding routing plate 223, a second waveguide routing plate 222, and a probe adaption plate 221. On advantage of the subplates is that only some of the subplates may be required to be switched out when testing different types of AUTs, or perhaps for different types of tests. The plate or subplates may comprise solid metal or a metalized plastic.

Figure 4:
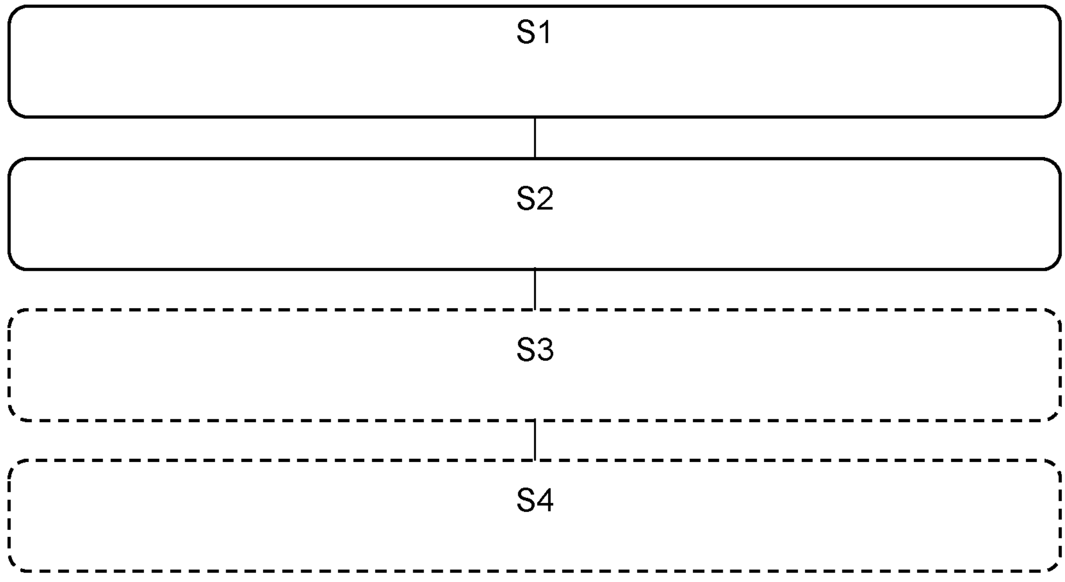
FIG. 4 is a flow chart illustrating methods.

In FIGS. 3 and 4 it can be seen that the eight second apertures 114 (arranged to interface with the AUT) are connected to eight first apertures 113 (arranged to interface with the first probe). The second apertures have a relatively complicated arrangement to match the AUT radiating elements. The first apertures, on the other hand, are arranged in a periodic pattern and are flared out (i.e., have larger separation).

With reference to FIG. 4, there is also disclosed herein a method for characterizing an antenna under test (AUT) 120 with a plurality of primary 123 and a plurality of secondary radiation elements 124, using an adapter arrangement 100 and a first probe 130 with a first probe aperture 131. The adapter arrangement 100 comprises a plate 110 with a first side 111 and a second side 112, and two or more waveguides 115 extending through the plate 110. Each waveguide has a first aperture 113 arranged on the first side 111 of the plate and a second aperture 114 arranged on the second side 112 of the plate. The second apertures 114 are arranged to mate with respective groups of primary radiation elements 123 of the AUT 120, where a group comprises one or more primary radiation elements. The first apertures 113 are arranged to mate with a first probe 130 with a first probe aperture 131. At least one of the first apertures 113 and/or the first probe aperture 131 is surrounded by a metamaterial structure 116.

The method comprises:

- arranging S1 the first probe 130 to mate with a first aperture 113 of one of the two or more waveguides 115 in the adapter arrangement 100; and
- arranging S2 the two or more second apertures 114 of respective waveguides 115 in the adapter arrangement 100 to mate with respective group of primary radiation elements 123 the AUT, wherein a primary element is internally connected in the AUT to a group of secondary radiation elements 124, where a group comprises one or more secondary radiation elements.

Using a single first probe may, e.g., be used to measure matching.

The method may further comprise providing S3 one or more second probes 140 to couple with the two or more groups.

Using a plurality of second probes makes it possible to measure from different locations at the same time or consecutively without having to move the second probe. This may be interesting when measuring gain, e.g.

The method may further comprise arranging S4, by a relative movement 132 between the first probe 130 and the adapter arrangement 100, the first probe to couple with another first aperture 113 of one of the two or more waveguides 115 in the adapter arrangement 100.

The relative movement may comprise respective linear movement in one or two dimensions.

According to aspects least, at least two first probes are arranged to mate with respective first apertures. Using a plurality of first probes makes it possible to measure isolation between the waveguiding paths connected to respective groups of primary radiation elements 123. Such measurement may be done together with measuring gain with one or more second probes.

Figure 5:
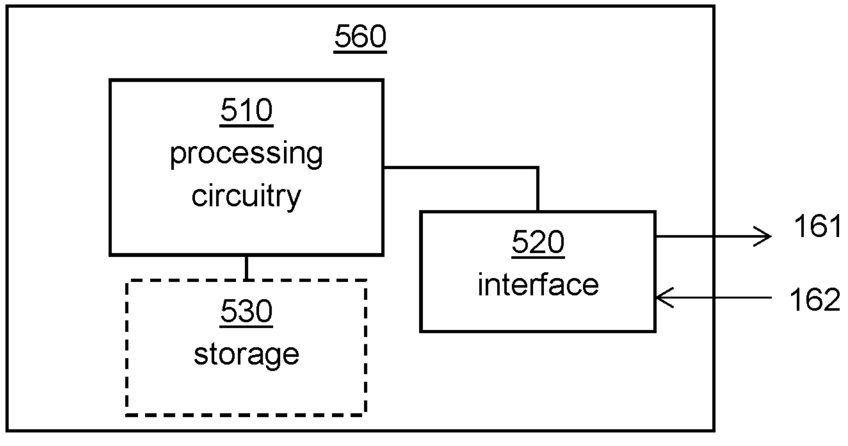
FIG. 5 shows an example control unit.

FIG. 5 schematically illustrates, in terms of a number of functional units, the components of a control unit 560. Processing circuitry 510 is provided using any combination of one or more of a suitable central processing unit CPU, multiprocessor, microcontroller, digital signal processor DSP, etc., capable of executing software instructions stored in a computer program product, e.g., in the form of a storage medium 530. The processing circuitry 510 may further be provided as at least one application specific integrated circuit ASIC, or field programmable gate array FPGA.

Particularly, the processing circuitry 510 is configured to cause the control unit 560 to perform a set of operations, or steps, such as the methods discussed in connection to FIG. 4. For example, the storage medium 530 may store the set of operations, and the processing circuitry 510 may be configured to retrieve the set of operations from the storage medium 530 to cause the control unit 560 to perform the set of operations. The set of operations may be provided as a set of executable instructions. Thus, the processing circuitry 510 is thereby arranged to execute methods as herein disclosed.

The storage medium 530 may also comprise persistent storage, which, for example, can be any single one or combination of magnetic memory, optical memory, solid state memory or even remotely mounted memory.

The control unit 560 may further comprise an interface 520 for communications with at least one external device. As such the interface 520 may comprise one or more transmitters and receivers, comprising analogue and digital components and a suitable number of ports for wireline or wireless communication.

The processing circuitry 510 controls the general operation of the control unit 560 e.g., by sending data and control signals to the interface 520 and the storage medium 530, by receiving data and reports from the interface 520, and by retrieving data and instructions from the storage medium 530. Other components, as well as the related functionality, of the control node are omitted in order not to obscure the concepts presented herein.

Figure 6:
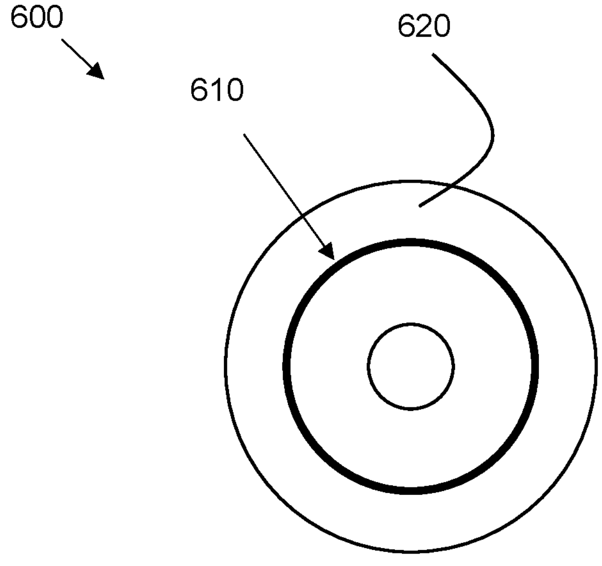
FIG. 6 illustrates a computer program product.

FIG. 6 schematically illustrates a computer program product 600, comprising a set of operations 610 executable by the control unit 560. The set of operations 610 may be loaded into the storage medium 530 in the control unit 560. The set of operations may correspond to the methods discussed above in connection to FIG. 3.

In the example of FIG. 6, the computer program product 600 is illustrated as an optical disc 620, such as a CD (compact disc) or a DVD (digital versatile disc) or a Blu-Ray disc. The computer program product could also be embodied as a memory, such as a random-access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program is here schematically shown as a track on the depicted optical disk, the computer program can be stored in any way which is suitable for the computer program product.

What is claimed is:

1. A measurement system for automated characterization of an antenna under test, AUT, with a plurality of radiation elements, the measurement system comprising the AUT, a first probe and an adapter arrangement, the adapter arrangement comprising:

- a plate with a first side and a second side; and
- two or more waveguides extending through the plate, where each waveguide has a first aperture arranged on the first side of the plate and a second aperture arranged on the second side of the plate,
- wherein the second apertures are arranged to mate with respective groups of radiation elements of the AUT, where a group comprises one or more radiation elements, and wherein the first apertures are arranged to mate with a first probe with a first probe aperture,
- wherein at least one of the first apertures and/or the first probe aperture is surrounded by a metamaterial structure, wherein the second side of the plate is arranged to be secured to the AUT by vacuum and/or fastening means, wherein the first apertures are arranged to individually mate with the first probe with a gap between the first probe and the individual aperture, wherein the gap is less than a wavelength of a center frequency in a band of operation, and wherein the plate is arranged to move relative to a room of the measurement system and the first probe is stationary in the room of the measurement system.

2. The measurement system according to claim 1, wherein all first apertures are surrounded by a metamaterial structure.

3. The measurement system according to claim 1, wherein the metamaterial structure comprises a repetitive structure of protruding elements.

4. The measurement system according to claim 1, wherein the plate comprises several subplates.

5. The measurement system according to claim 4, wherein the plate comprises four subplates: an AUT adaption plate, a first waveguiding routing pate, a second waveguide routing plate, and a probe adaption plate.

6. The measurement system according to claim 1, wherein the radiation elements of the AUT are feed ports on a distribution layer of the AUT.

7. The measurement system according to claim 1, wherein the radiation elements of the AUT are radiation elements on a radiation layer of the AUT.

8. The measurement system according to claim 1, wherein at least one of the one or more of the second apertures is surrounded by a metamaterial structure.

9. The measurement system according to claim 8, wherein the metamaterial structure surrounding the one or more of the second apertures comprises a repetitive structure of protruding elements.

10. The measurement system according to claim 1, wherein at least one of the waveguides is arranged to rotate the polarization of the electromagnetic signal traversing the waveguide.

11. The measurement system according to claim 1, wherein the gap is less than half of a wavelength of the center frequency.

12. The measurement system according to claim 11, wherein the gap is less than a quarter of a wavelength of the center frequency.

13. A kit of parts comprising a first probe with a first probe aperture and an adapter arrangement the adapter arrangement comprising:

a plate with a first side and a second side; and two or more waveguides extending through the plate, where each waveguide has a first aperture arranged on the first side of the plate and a second aperture arranged on the second side of the plate, wherein the second apertures are arranged to mate with respective groups of radiation elements of an antenna under test, AUT, where a group comprises one or more radiation elements, and wherein the first apertures are arranged to mate with the first probe with a first probe aperture, and wherein at least one of the first apertures and/or the first probe aperture is surrounded by a metamaterial structure, wherein the second side of the plate is arranged to be secured to the AUT by vacuum and/or fastening means, wherein the first apertures are arranged to individually mate with the first probe with a gap between the first probe and the individual aperture, wherein the gap is less than a wavelength of a center frequency in a band of operation, and wherein the plate is configured to move relative to the first probe which is configured to be stationary.

14. A method for characterizing an antenna under test, AUT, using a measurement setup, wherein the measurement setup comprises the AUT with a plurality of primary and a plurality of secondary radiation elements, an adapter arrangement and a first probe with a first probe aperture, the adapter arrangement comprising:

a plate with a first side and a second side; and two or more waveguides extending through the plate, where each waveguide has a first aperture arranged on the first side of the plate and a second aperture arranged on the second side of the plate, wherein the second apertures are arranged to mate with respective groups of primary radiation elements of the AUT, where a group comprises one or more primary radiation elements, and wherein the first apertures are arranged to mate with a first probe with a first probe aperture, wherein at least one of the first apertures and/or the first probe aperture is surrounded by a metamaterial structure, wherein the second side of the plate is arranged to be secured to the AUT by vacuum and/or fastening means, wherein the first apertures are arranged to individually mate with the first probe with a gap between the first probe and the individual aperture, and wherein the gap is less than a wavelength of a center frequency in a band of operation, wherein the method comprises:

arranging the first probe to mate with a first aperture of one of the two or more waveguides in the adapter arrangement;

arranging the two or more second apertures of respective waveguides in the adapter arrangement to mate with respective groups of primary radiation elements of the AUT, wherein a primary element is internally connected in the AUT to a group of secondary radiation elements, where a group comprises one or more secondary radiation elements; and arranging, by a movement of the adapter arrangement relative to the room of the measurement setup, the first probe to couple with another first aperture of one of the two or more waveguides in the adapter arrangement.

15. The method according to claim 14, further comprising providing one or more second probes to couple with the two or more groups of secondary radiation elements.

16. The method according to claim 14, wherein the relative movement comprises respective linear movement in one or two dimensions.

17. The method according to claim 14, wherein at least two first probes are arranged to mate with respective first apertures.

18. A computer program comprising program code means for performing the steps of claim 14 when said program is run on a computer or on processing circuitry of a control unit.

19. The method according to claim 14, wherein the gap is less than half of a wavelength of the center frequency.

20. The method according to claim 19, wherein the gap is less than a quarter of a wavelength of the center frequency.

* * * * *